(12) United States Patent
Hatai et al.

(10) Patent No.: US 9,704,831 B2
(45) Date of Patent: Jul. 11, 2017

(54) POWER SEMICONDUCTOR MODULE

(75) Inventors: Akira Hatai, Chiyoda-ku (JP); Shizuri Tamura, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/698,901

(22) PCT Filed: May 21, 2010

(86) PCT No.: PCT/JP2010/058665
§ 371 (c)(1),
(2), (4) Date: Nov. 19, 2012

(87) PCT Pub. No.: WO2011/145219
PCT Pub. Date: Nov. 24, 2011

(65) Prior Publication Data
US 2013/0056755 A1    Mar. 7, 2013

(51) Int. Cl.
| H01L 23/498 | (2006.01) |
| H01L 23/64 | (2006.01) |
| H01L 25/18 | (2006.01) |
| H01L 25/07 | (2006.01) |
| H01L 23/552 | (2006.01) |

(52) U.S. Cl.
CPC ...... H01L 25/074 (2013.01); H01L 23/49805 (2013.01); H01L 23/49844 (2013.01); H01L 23/552 (2013.01); H01L 23/645 (2013.01); H01L 25/18 (2013.01); *H01L 2224/48091* (2013.01); *H01L 2224/48137* (2013.01); *H01L 2224/48227* (2013.01); *H01L 2924/1305* (2013.01); *H01L 2924/13055* (2013.01); *H01L 2924/3025* (2013.01); *H01L 2924/30107* (2013.01)

(58) Field of Classification Search
CPC ...... H01L 23/645; H01L 25/074; H01L 25/18
USPC .......................................... 257/77, E29.104
See application file for complete search history.

(56) References Cited

U.S. PATENT DOCUMENTS

| 5,719,436 A * | 2/1998 | Kuhn ............................ 257/676 |
| 6,525,950 B1 | 2/2003 | Shirakawa et al. |
| 2002/0024129 A1* | 2/2002 | Hirahara et al. ............. 257/691 |
| 2002/0089321 A1* | 7/2002 | Matsuda ................. H02M 1/38 |
| | | 324/142 |

(Continued)

FOREIGN PATENT DOCUMENTS

| JP | 5-161268 A | 6/1993 |
| JP | 2001-286158 A | 10/2001 |

(Continued)

OTHER PUBLICATIONS

The State Intellectual Property of the Republic of China, "Office Action," issued in connection with Chinese Patent Application No. 201080066906.3, dated Dec. 18, 2013.

*Primary Examiner* — Marvin Payen
*Assistant Examiner* — Vernon P Webb
(74) *Attorney, Agent, or Firm* — Sughrue Mion, PLLC; Richard C. Turner

(57) ABSTRACT

A transistor chip formed from a wide band gap semiconductor, on which transistor elements for an upper arm are formed is mounted on a front surface of an insulating substrate. A transistor chip formed from a wide band gap semiconductor, on which transistor elements for a lower arm are formed is mounted on a rear surface of the insulating substrate.

11 Claims, 11 Drawing Sheets

(56) References Cited

U.S. PATENT DOCUMENTS

| | | | |
|---|---|---|---|
| 2004/0089934 A1* | 5/2004 | Shimoida | H01L 25/071 257/686 |
| 2010/0309700 A1 | 12/2010 | Maeda et al. | |
| 2011/0062491 A1* | 3/2011 | Nakata | 257/146 |

FOREIGN PATENT DOCUMENTS

| | | |
|---|---|---|
| JP | 2002-026251 A | 1/2002 |
| JP | 2002-353571 A | 12/2002 |
| JP | 2004-022844 A | 1/2004 |
| JP | 2007-012721 A | 1/2007 |
| JP | 2009183115 A | 8/2009 |
| WO | 2009/150875 A1 | 12/2009 |

* cited by examiner

POWER SEMICONDUCTOR MODULE

CROSS REFERENCE TO RELATED APPLICATIONS

This application is a National Stage of International Application No. PCT/JP2010/058665 filed May 21, 2010, the contents of all of which are incorporated herein by reference in their entirety.

FIELD

The present invention relates to a power converting device and, more particularly, to a mounting structure for a power semiconductor module used in the power converting device.

BACKGROUND

A power semiconductor module used in a power converting device for driving a motor has a large heat value during operation. The heat generation occurs in power semiconductor elements such as transistor elements and diode elements mounted on the inside of the power semiconductor module. For this reason, in the conventional power converting device, a cooling structure such as a cooling fin or a cooling fan is provided on the outside of the power semiconductor module to perform heat dissipation and cooling of the power semiconductor module.

Patent Literature 1 discloses a technique in which internal uneven heat distribution and temperature gradient can be reduced, inductance component due to interconnect line between semiconductor elements can be reduced, and cooling can be performed efficiently depending on the conditions of heat generation of a power semiconductor element. In this technique, there is disclosed a power semiconductor module comprising a cooling substrate, and at least two power semiconductor elements mounted, respectively, on the front and rear of the substrate. The power semiconductor elements include an IGBT and a diode, the IGBT is mounted on the front or rear of the substrate, and the diode is mounted on the front or rear of the substrate at a position matching the mounting position of the IGBT while interposing the substrate.

Patent Literature 2 discloses a technique to reduce inductance in a semiconductor device which causes increase of overshooting voltage when switching, accompanying an element breakdown and an increase of power loss. In this technique, a part of wiring to bridge-connect semiconductor switches is made in lamination, and at least two DC terminal pairs, each connected to the part of the wiring, are disposed arranging the plus poles and the minus poles alternately on one side of the upper face of the square case of the semiconductor.

CITATION LIST

Patent Literature

Patent Literature 1: Japanese Patent Application Laid-Open No. 2007-012721
Patent Literature 2: Japanese Patent Application Laid-Open No. 2001-286158

SUMMARY

Technical Problem

However, in the method of providing the cooling structure such as the cooling fin or the cooling fan on the outside of the power semiconductor module, there is a problem in that the cooling structure may be a factor that hinders reduction in size and reduction in costs for the power converting device.

In the method disclosed in Patent Literature 1, there is a problem in that reduction in size and reduction in costs for the power semiconductor module are hindered because the power semiconductor elements are mounted on both the surfaces while interposing the cooling substrate.

In the method disclosed in Patent Literature 2, there is a problem in that increase in size of the power semiconductor module is caused because the semiconductor switch is mounted on one surface of the metal bottom plate.

The present invention has been devised in view of the above circumstances, and it is an object of the present invention to realize a low-noise, small and low-cost power semiconductor module by mounting power semiconductor elements on both surfaces of a substrate without interposing a cooling substrate.

Solution to Problem

To solve the problems and attain the object, a power semiconductor module according to the present invention includes a first insulating substrate, on both surfaces of which conductor patterns are formed, a first transistor chip that is mounted on the front surface of the insulating substrate and comprised of a wide band gap semiconductor on which a transistor element for an upper arm is formed, and a second transistor chip that is mounted on the rear surface of the insulating substrate and comprised of a wide band-gap semiconductor on which a transistor element for a lower arm is formed, wherein the conductor patterns on both sides of the insulating substrate are arranged plane-symmetrically.

Advantageous Effects of Invention

According to the present invention, there is an advantageous effect that it is possible to mount transistor chips on which transistor elements are formed, on both the surfaces of the insulating substrate and realize reduction in noise, reduction in size, and reduction in costs for the power semiconductor module, without providing a cooling structure such as a cooling substrate, cooling fin or cooing fan.

DESCRIPTION OF EMBODIMENTS

Embodiments of a power semiconductor module according to the present invention are described in detail below with reference to the drawings. In the following embodiments, a power semiconductor module including upper arms and lower arms for three phases is described by way of example. However, the present invention is not limited to the embodiments.

First Embodiment

FIG. 1(a) is a plan view showing a schematic configuration of a power semiconductor module PM1 of a first embodiment according to the present invention. FIG. 1(b) is a rear view showing the schematic configuration of the power semiconductor module PM1 of the first embodiment according to the present invention. FIG. 1(c) is a side view showing the schematic configuration of the power semiconductor module PM1 of the first embodiment according to the present invention. FIG. 1(d) is a sectional view taken along an A-A' line of FIG. 1(a) to FIG. 1(c).

Figure 1:
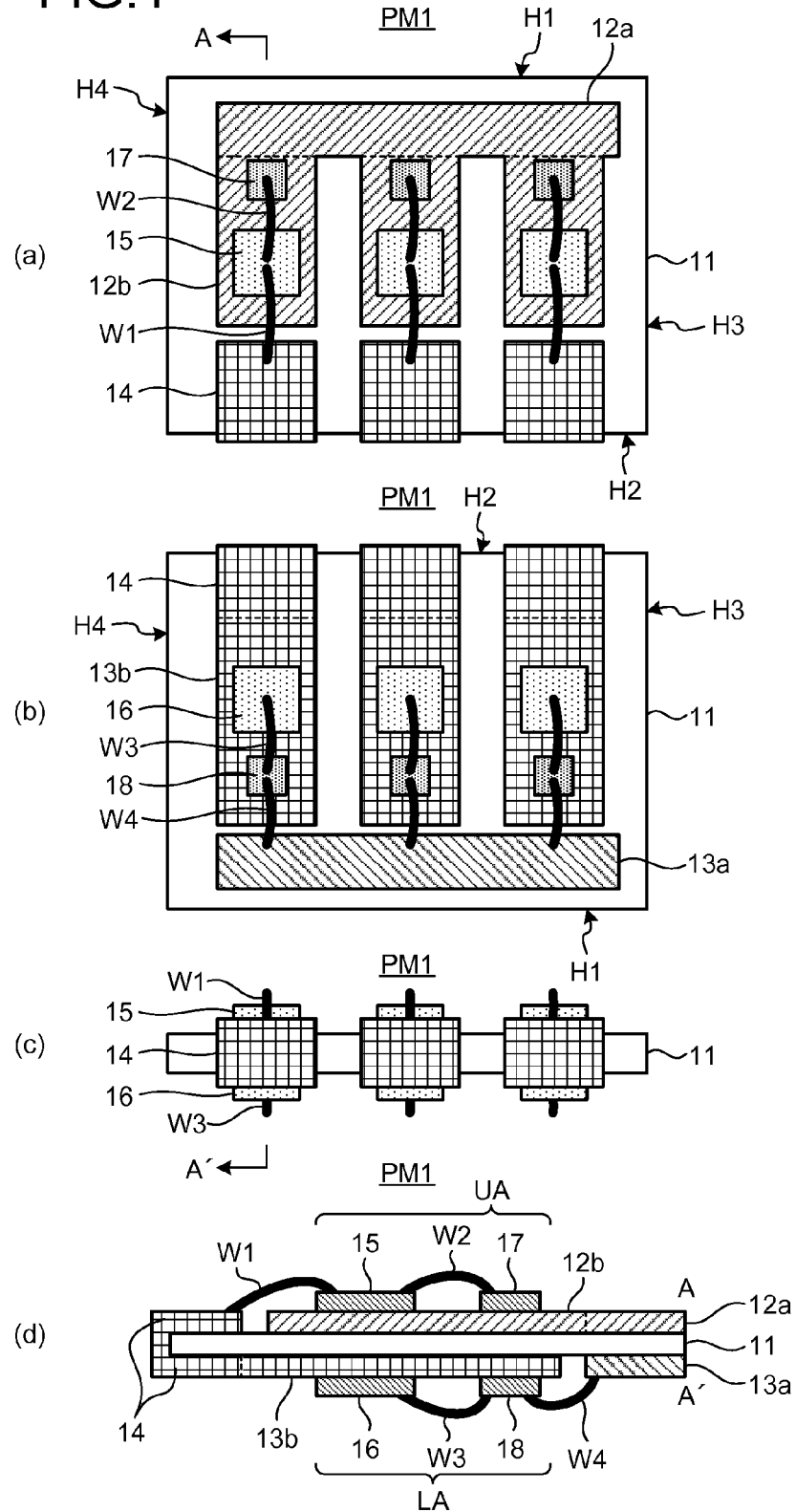
FIG. 1(a) has a plan view (a) showing a schematic configuration of a power semiconductor module of a first embodiment according to the present invention, a rear view (b) showing the schematic configuration of the power semiconductor module of the first embodiment according to the present invention, a side view (c) showing the schematic configuration of the power semiconductor module of the first embodiment according to the present invention, and a sectional view (d) taken along an A-A' line of the views (a) to (c).

In FIG. 1, a positive side conductor pattern 12a for inter-phase connection is formed on the front surface of an insulating substrate 11. A negative side conductor pattern 13a for inter-phase connection is formed on the rear surface of the insulating substrate 11. On the insulating substrate 11, sides H1 and H2 opposed to each other are provided and sides H3 and H4 orthogonal to the sides H1 and H2 are provided. As a material of the insulating substrate 11, a resin substrate such as a glass epoxy substrate may be used, a film substrate formed of polyimide or the like may be used, or an inorganic substrate such as a ceramic substrate may be used.

The positive side conductor pattern 12a and the negative side conductor pattern 13a are configured to be plane-symmetrical to each other and are arranged to be opposed to each other interposing the insulating substrate 11 therebetween. The positive side conductor pattern 12a and the negative side conductor pattern 13a are arranged in a peripheral edge portion of the insulating substrate 11 along the side H1.

An output conductor pattern 14 is formed for each of phases on the front surface and the rear surface of the insulating substrate 11. Parts of the output conductor pattern 14 are configured to be plane-symmetrical to each other on the front surface side and the rear surface side of the insulating substrate 11 and are arranged to be opposed to each other interposing the insulating substrate 11 therebetween. The output conductor patterns 14 are arranged on the peripheral edge portion of the insulating substrate 11 along the side H2. The output conductor patterns 14 may be formed in a shape sandwiching the insulating substrate 11 therebetween from above and below by way of a side surface of the insulating substrate 11 on the side H2 side or a shape integrally formed to extend from the front surface to the rear surface of the insulating substrate 11 via the side surface thereof. For example, a sectional shape of the output conductor pattern 14 can be formed in a C shape.

A positive side conductor pattern 12b for element arrangement is formed on the front surface of the insulating substrate 11 for each of the phases. A negative side conductor pattern 13b for element arrangement is formed on the rear surface of the insulating substrate 11 for each of the phases. The positive side conductor pattern 12b is connected to the positive side conductor pattern 12a. The negative side conductor pattern 13b is connected to the output conductor pattern 14. The positive side conductor patterns 12b can be formed integrally with the positive side conductor pattern 12a. The negative side conductor pattern 13b can be formed integrally with the output conductor pattern 14.

The positive side conductor pattern 12b is arranged between the positive side conductor pattern 12a and the output conductor pattern 14. The negative side conductor pattern 13b is arranged between the negative side conductor pattern 13a and the output conductor pattern 14. The positive side conductor pattern 12b and the negative side conductor pattern 13b are arranged to be opposed to each other interposing the insulating substrate 11 therebetween.

As a material of the positive side conductor patterns 12a and 12b, the negative side conductor patterns 13a and 13b, and the output conductor patterns 14, metal having satisfactory electric conductivity such as Cu or Al can be used. The surfaces of the positive side conductor patterns 12b and the negative side conductor patterns 13b may be coated with a solder material.

Then, on the positive side conductor pattern 12b, a transistor chip 15 and a diode chip 17 are mounted in a bare state for each of the phases. On the negative side conductor pattern 13b, a transistor chip 16 and a diode chip 18 are mounted in a bare state for each of the phases. On the transistor chips 15, transistor elements for an upper arm UA are formed. On the transistor chips 16, transistor elements for a lower arm LA are formed. As a material of the transistor chips 15 and 16 and the diode chips 17 and 18, a wide band gap semiconductor such as SiC, GaN or diamond is used.

The transistor chip 15 and the output conductor pattern 14 are connected for each of the phases by a bonding wire W1 and the transistor chip 15 and the diode chip 17 are connected for each of the phases by a bonding wire W2, whereby the upper arm UA is formed on the front surface of the insulating substrate 11. The transistor chip 16 and the diode chip 18 are connected for each of the phases by a bonding wire W3 and the diode chip 18 and the negative side conductor pattern 13a are connected for each of the phases by a bonding wire W4, whereby the lower arm LA is formed on the rear surface of the insulating substrate 11.

Paths formed by the positive side conductor patterns 12a and 12b, the upper arm UA, the output conductor patterns 14, the lower arm LA, and the negative side conductor patterns 13a and 13b are configured to be plane-symmetrical sandwiching the insulating substrate 11.

Figure 2:
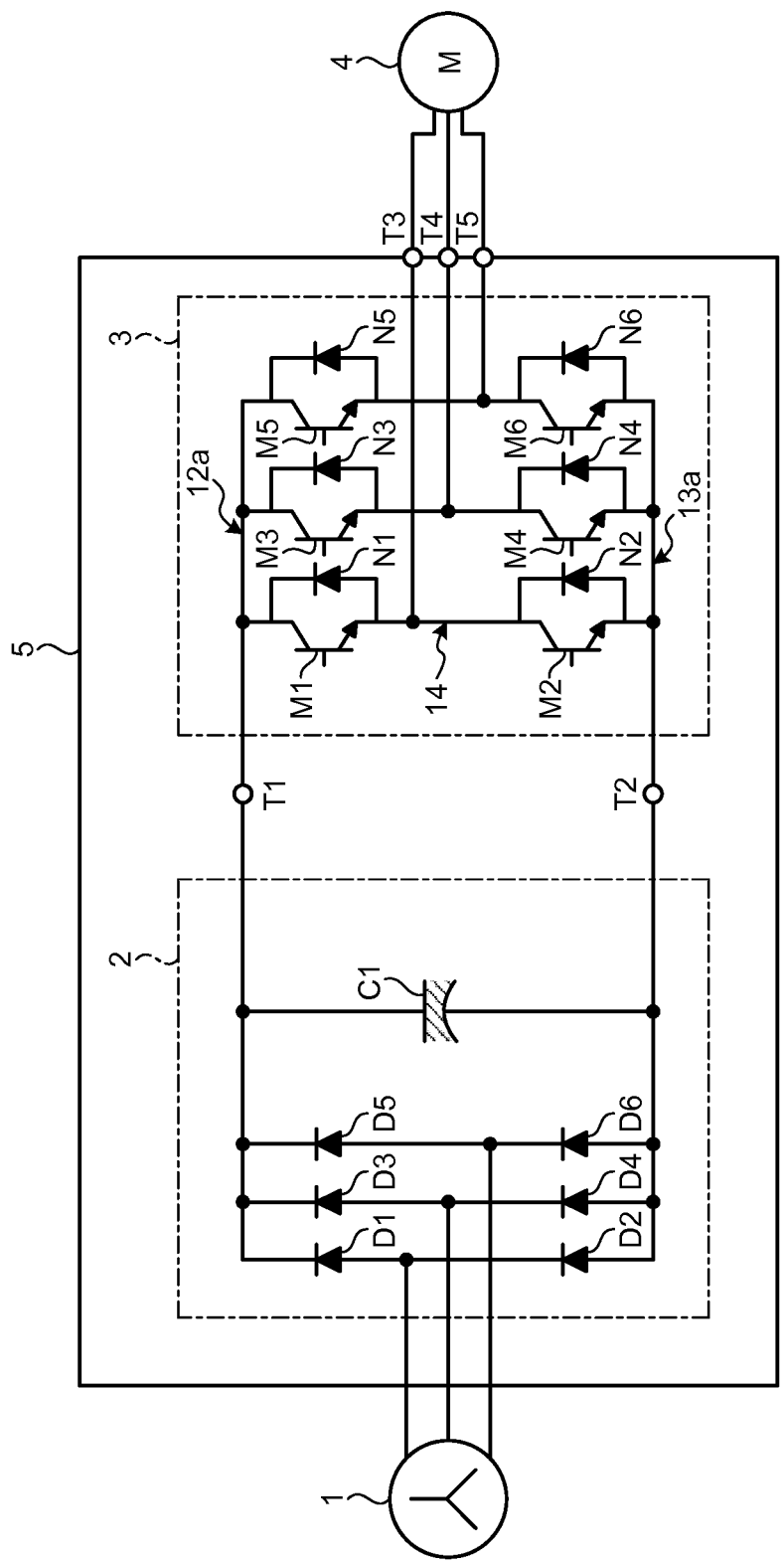
FIG. 2 is a diagram showing a circuit configuration of a power converting device including the power semiconductor module shown in FIG. 1.

FIG. 2 is a diagram showing a circuit configuration of a power converting device including the power semiconductor module PM1 shown in FIG. 1. The power semiconductor module PM1 shown in FIG. 1 constitutes an inverter 3 shown in FIG. 2. In FIG. 2, a power converting device 5 has a converter 2 and the inverter 3. The converter 2 that converts an alternating current into a direct current is provided at a stage before the inverter 3. A three-phase power supply 1 is provided as a power supply for driving the converter 2. A motor 4 is provided as an external load of the inverter 3. The inverter 3 is provided with direct-current input terminals T1 and T2 used for connection to the converter 2 and alternating-current output terminals T3 to T5 used for connection to the motor 4.

In the converter 2, rectifying diodes D1 to D6 and a smoothing capacitor C1 are provided. The rectifying diodes D1 and D2 are connected in series to each other, the rectifying diodes D3 and D4 are connected in series to each other, and the rectifying diodes D5 and D6 are connected in series to each other. The three-phase power supply 1 is connected to a connection point of the rectifying diodes D1 and D2, a connection point of the rectifying diodes D3 and D4, and a connection point of the rectifying diodes D5 and D6. The smoothing capacitor C1 is connected in parallel to a series circuit of the rectifying diodes D1 and D2, a series circuit of the rectifying diodes D3 and D4, and a series circuit of the rectifying diodes D5 and D6.

In the inverter 3, transistor elements M1 to M6 and freewheeling diodes N1 to N6 are provided. In FIG. 2, there is shown a configuration in the case of three phases in which transistor elements and diode elements are subjected to series and parallel connection. As the transistor elements M1 to M6, IGBTs may be used, bipolar transistors may be used, or field-effect transistors may be used.

When general IGBT elements are used as the transistor elements, a form of connecting bonding wires to their emitter terminals and soldering their collector terminals on conductor patterns is generally used. Therefore, also in FIG. 1, such connection using the IGBT elements is assumed. However, a form of soldering the emitter terminals on the conductor patterns and connecting the bonding wires on the collector terminals can be realized, although not generally used. A connection form to be adopted can be selected according to necessity.

The freewheeling diodes N1 to N6 are connected in parallel to the transistor elements M1 to M6, respectively. The transistor elements M1 and M2 are connected in series to each other, the transistor elements M3 and M4 are connected in series to each other, and the transistor elements M5 and M6 are connected in series to each other. The motor 4 is connected, via the alternating-current output terminals T3 to T5, to a connection point of the transistor elements M1 and M2, a connection point of the transistor elements M3 and M4, and a connection point of the transistor elements M5 and M6. When field effect transistors are used as the transistor elements, parasitic diodes of the field effect transistors may be used in place of the freewheeling diodes N1 to N6. In this point, diode elements do not have to be separately connected to the field-effect transistors.

The transistor elements M1, M3 and M5 constitute the upper arm UA for three phases of the inverter 3. The transistor elements M2, M4 and M6 constitute the lower arm LA for three phases of the inverter 3

The transistor elements M1, M3 and M5 are formed in the transistor chips 15 of the phases shown in FIG. 1, respectively. The transistor elements M2, M4 and M6 are formed in the transistor chips 16 of the phases shown in FIG. 1, respectively. The freewheeling diodes N1, N3, and N5 shown in FIG. 2 are formed in the diode chips 17 of the phases shown in FIG. 1, respectively. The freewheeling diodes N2, N4 and N6 shown in FIG. 2 are formed in the diode chips 18 of the phases shown in FIG. 1, respectively.

When an alternating current is inputted to the converter 2 from the three-phase power supply 1, the alternating current is converted into a direct current by the converter 2, and the direct current is inputted to the inverter 3. In the inverter 3, the direct current is converted into an alternating current according to a switching operation of the transistor elements M1 to M6. Then, the alternating current is supplied to the motor 4, whereby the motor 4 is driven in PWM control.

If wide band gap semiconductor is used as a material of the transistor chips 15 and 16 shown in FIG. 1, it is possible to substantially reduce losses of the transistor elements M1 to M6, and enable the transistor elements M1 to M6 to withstand operation at high temperature. Thereby, it is possible to mount the transistor chips 15 and 16 on both the surfaces of the insulating substrate 11 without interposing a cooling substrate between the transistor chips 15 and 16 and without providing a cooling mechanism such as a fan or a fin on the outside.

If wide band gap semiconductor is used for the diode chips 17 and 18 shown in FIG. 1, it is possible to substantially reduce losses of the diode elements N1 to N6, and enable the diode elements N1 to N6 to withstand operation at high temperature. Thereby, it is possible to mount the diode chips 17 and 18 on both the surfaces of the insulating substrate 11 without interposing a cooling substrate between the diode chips 17 and 18 and without providing a cooling mechanism such as a fan or a fin on the outside.

As explained above, since the cooling structure is made unnecessary by using the wide band gap semiconductor, it is possible to realize reduction in size and reduction in costs for the power semiconductor module PM1. In addition, it is possible to prevent thermal fatigue from being caused in joining portions of the transistor chips 15 and 16 and the diode chips 17 and 18 and the bonding wires W1 to W4 and joining sections of the transistor chips 15 and 16 and the diode chips 17 and 18 and the positive side conductor patterns 12b and negative side conductor patterns 13b, thereby to improve reliability on a temperature cycle and a power cycle. Besides, even when the power semiconductor module PM1 reduced in size without interposing a cooling substrate is used, it is possible to prevent the operation of the inverter 3 from being an obstacle.

The positive side conductor pattern 12a and the negative side conductor pattern 13a are configured to be plane-symmetrical to each other and are arranged to be opposed to each other interposing the insulating substrate 11 therebetween. Consequently, it is possible to offset an inductance component of the positive side conductor pattern 12a against an inductance component of the negative side conductor pattern 13a.

Therefore, it is possible to reduce noise and surges caused by involvement of the inductance components of the conductor patterns. In this case, because the wide band gap semiconductor is used, it is unnecessary to use the cooling substrate so that the thickness of the insulating substrate can be reduced, thereby enhancing the offset effect of the conductor inductances on the front and the rear of the substrate and further enhancing the reduction effect of noise and surges. In addition, it is unnecessary to design element arrangement or the like paying attention to heat generation timing of the transistor elements and the diode elements for the purpose of heat dissipation and cooling.

Parts of the output conductor patterns 14 are configured to be plane-symmetrical to each other on the front surface side and the rear surface side of the insulating substrate 11 and are arranged to be opposed to each other interposing the insulating substrate 11 therebetween. Consequently, it is possible to offset inductance components of the output conductor patterns 14 and reduce noise and surges.

The paths formed by the positive side conductor patterns 12a and 12b, the upper arm UA, the output conductor patterns 14, the lower arm LA, and the negative side conductor patterns 13a and 13b are configured to be plane-symmetrical while sandwiching the insulating substrate 11 therein. Consequently, it is possible to offset an inductance component of the paths on the front side of the insulating substrate 11 and an inductance component of the paths on the rear side of the insulating substrate 11. Therefore, it is possible to reduce high-frequency components flowing to the upper arm UA and the lower arm LA via junction capacitance of the transistor chips 15 and 16.

Second Embodiment

FIG. 3(a) is a plan view showing a schematic configuration of a power semiconductor module PM2 of a second embodiment according to the present invention. FIG. 3(b) is one side view showing the schematic configuration of the power semiconductor module PM2 of the second embodiment according to the present invention. FIG. 3(c) is a rear view showing the schematic configuration of the power semiconductor module PM2 of the second embodiment according to the present invention. FIG. 3(d) is the other side view showing the schematic configuration of the power semiconductor module PM2 of the second embodiment according to the present invention.

Figure 3:
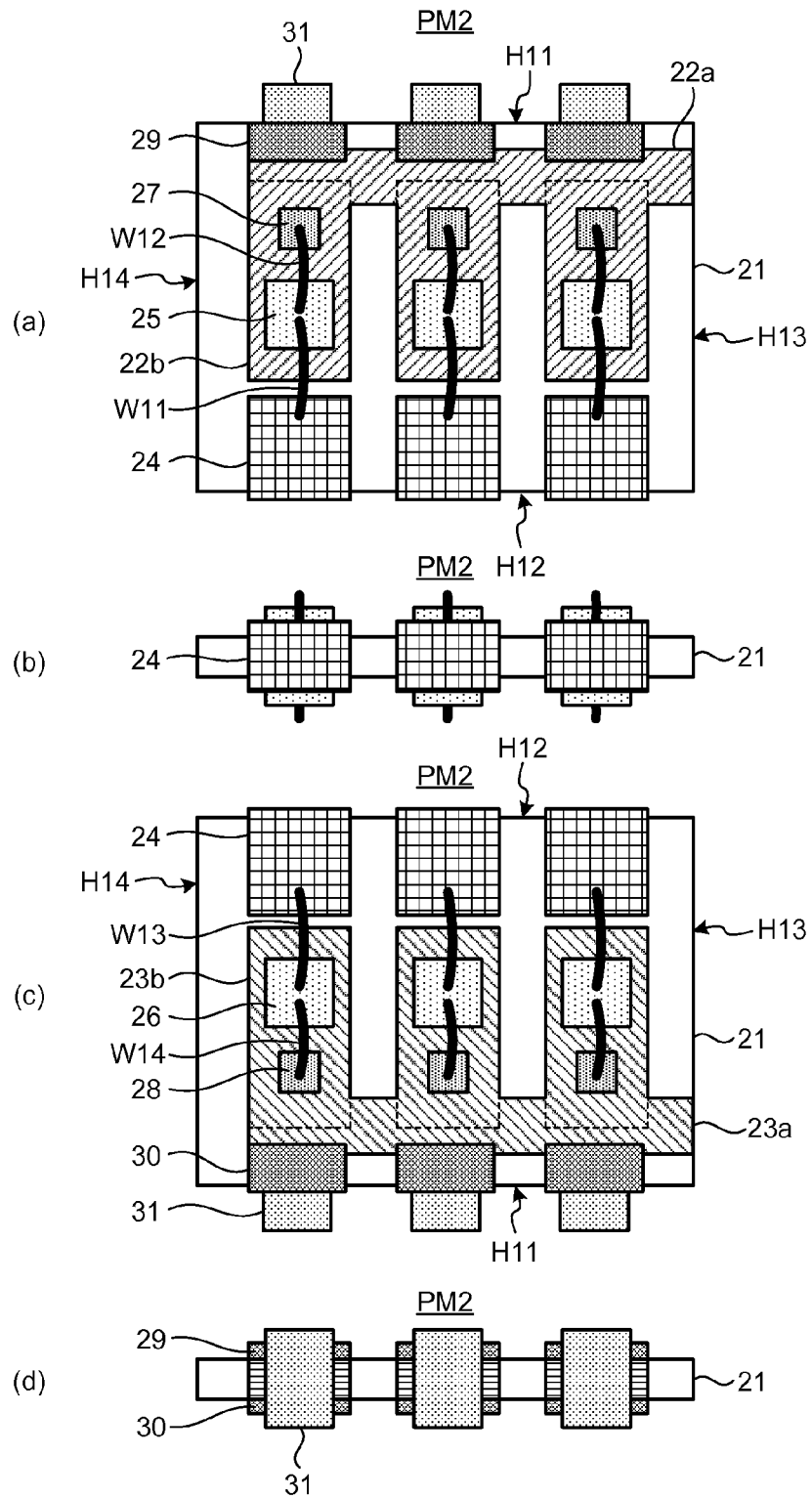
FIG. 3 has a plan view (a) showing a schematic configuration of the power semiconductor module of a second embodiment according to the present invention, one side view (b) showing the schematic configuration of the power semiconductor module of the second embodiment according to the present invention, a rear view (c) showing the schematic configuration of the power semiconductor module of the second embodiment according to the present invention, and the other side view (d) showing the schematic configuration of the power semiconductor module of the second embodiment according to the present invention.

In FIG. 3, a positive side conductor pattern 22a for inter-phase connection is formed on the front surface of an insulating substrate 21. A negative side conductor pattern 23a for inter-phase connection is formed on the rear surface of the insulating substrate 21. On the insulating substrate 21, sides H11 and H12 opposed to each other are provided and sides H13 and H14 orthogonal to the sides H11 and H12 are provided. As a material of the insulating substrate 21, a resin substrate such as a glass epoxy substrate may be used, a film substrate formed of polyimide or the like may be used, or an inorganic substrate such as a ceramic substrate may be used.

The positive side conductor pattern 22a and the negative side conductor pattern 23a are configured to be plane-symmetrical to each other and are arranged to be opposed to each other interposing the insulating substrate 21 therebetween. The positive side conductor pattern 22a and the negative side conductor pattern 23a are arranged in a peripheral edge portion of the insulating substrate 21 along the side H11.

An output conductor pattern 24 is formed for each of phases on the front surface and the rear surface of the insulating substrate 21. Parts of the output conductor pattern 24 are configured to be plane-symmetrical to each other on the front surface side and the rear surface side of the insulating substrate 21 and are arranged to be opposed to each other interposing the insulating substrate 21 therebetween. The output conductor patterns 24 are arranged in the peripheral edge portion of the insulating substrate 21 along the side H12. The output conductor pattern 24 may be formed in a shape sandwiching the insulating substrate 21 from above and below by way of a side surface on the side H12 side of the insulating substrate 21 or a shape integrally formed to extend from the front surface to the rear surface via the side surface of the insulating substrate 21. For example, a sectional shape of the output conductor patterns 24 can be formed in a C shape.

A positive side conductor pattern 22b for chip arrangement is formed for each of the phases on the front surface of the insulating substrate 21. A negative side conductor pattern 23b for chip arrangement is formed for each of the phases on the rear surface of the insulating substrate 21. The positive side conductor patterns 22b are connected to the positive side conductor pattern 22a. The negative side conductor patterns 23b are connected to the negative side conductor pattern 23a. The positive side conductor patterns 22b can be formed integrally with the positive side conductor pattern 22a. The negative side conductor patterns 23b can be formed integrally with the negative side conductor pattern 23a.

The positive side conductor patterns 22b are arranged between the positive side conductor pattern 22a and the output conductor patterns 24. The negative side conductor patterns 23b are arranged between the negative side conductor pattern 23a and the output conductor patterns 24. The positive side conductor patterns 22b and the negative side conductor patterns 23b are arranged to be opposed to each other interposing the insulating substrate 21 therebetween.

As a material of the positive side conductor patterns 22a and 22b, the negative side conductor patterns 23a and 23b, and the output conductor patterns 24, metal having satisfactory electric conductivity such as Cu or Al can be used. The surfaces of the positive side conductor patterns 22b and the negative side conductor patterns 23b may be coated with a solder material.

On the positive side conductor pattern 22b, a transistor chip 25 and a diode chip 27 are mounted in a bare state for each of the phases. On the negative side conductor pattern 23b, a transistor chip 26 and a diode chip 28 are mounted in a bare state for each of the phases.

As a material of the transistor chips 25 and 26 and the diode chips 27 and 28, a wide band gap semiconductor such as SiC, GaN, or diamond is used.

In this embodiment, it is assumed that IGBTs are used as the transistor chips. In this embodiment, the IGBT functioning as the transistor chip 25 to be mounted on the front of the insulating substrate 21 has a collector terminal soldered to the conductor pattern and an emitter terminal connected to a bonding wire. The IGBT functioning as the transistor chip 26 to be mounted on the rear of the insulating substrate 21 has an emitter terminal soldered to the conductor pattern and a collector terminal connected to a bonding wire.

The transistor chip 25 and the output conductor pattern 24 are connected for each of the phases by a bonding wire W11 and the transistor chip 25 and the diode chip 27 are connected for each of the phases by a bonding wire W12. The transistor chip 26 and the output conductor pattern 24 is connected for each of the phases by a bonding wire W13 and the transistor chip 26 and the diode chip 28 are connected for each of the phases by a bonding wire W14.

The bonding wires W11 and W13 are arranged to be plane-symmetrical to each other interposing the insulating substrate 21 therebetween. The bonding wires W12 and W14 are arranged to be plane-symmetrical to each other interposing the insulating substrate 21 therebetween.

On the front surface of the insulating substrate 21, positive side potential terminals 29 connected to the positive side conductor pattern 22a are formed to extend over the side H11. On the rear surface of the insulating substrate 21, negative side potential terminals 30 connected to the negative side conductor pattern 23a are formed to extend over the side H11.

Snubber capacitors 31 are disposed on the side surface on the side H11 side of the insulating substrate 21. Then, the positive side potential terminal 29 and the negative side potential terminal 30 are connected to each other by the snubber capacitor 31.

If a wide band gap semiconductor is used as a material of the transistor chips 25 and 26, it is possible to substantially reduce losses of the transistor elements M1 to M6, and enable the transistor elements M1 to M6 to withstand operation at high temperature. Thereby, it is possible to mount the transistor elements 25 and 26 on both the surfaces of the insulating substrate 21 without interposing a cooling substrate between the transistor chips 25 and 26 and without providing a cooling mechanism such as a fan or a fin on the outside.

If the wide band gap semiconductor is used for the diode chips 27 and 28 shown in FIG. 3, it is possible to substantially reduce losses of the freewheeling diode elements N1 to N6, and enable the diode elements N1 to N6 to withstand operation at high temperature. Thereby, it is possible to mount the diode chips 27 and 28 on both the surfaces of the insulating substrate 21 without interposing a cooling substrate between the diode chips 27 and 28 and without providing a cooling mechanism such as a fan or a fin on the outside.

As explained above, since the cooling structure is made unnecessary by using the wide band gap semiconductor, it is possible to realize reduction in size and reduction in costs of the power semiconductor module PM2. In addition, it is possible to suppress thermal fatigue from being caused in joining portions of the transistor chips 25 and 26 and diode chips 27 and 28 and the bonding wires W11 to W14, and joining portions of the transistor chips 25 and 26 and diode chips 27 and 28 and the positive side conductor patterns 22b and negative side conductor patterns 23b, so that reliability on a temperature cycle and a power cycle can be improved. Even when the power semiconductor module PM2 reduced in size without interposing a cooling substrate is used, it is possible to prevent the operation of the inverter 3 from being hindered.

The positive side conductor pattern 22a and the negative side conductor pattern 23a are configured to be plane-symmetrical to each other and are arranged to be opposed to each other interposing the insulating substrate 21 therebetween. Consequently, it is possible to offset an inductance component of the positive side conductor pattern 22a and an inductance component of the negative side conductor pattern 23a, thereby reducing noise and surges.

Further, the positive side conductor patterns 22b and the negative side conductor patterns 23b are configured to be plane-symmetrical to each other and are arranged to be opposed to each other interposing the insulating substrate 21 therebetween. Consequently, it is possible to offset an inductance component of the positive side conductor patterns 22b and an inductance component of the negative side conductor patterns 23b, thereby reducing noise and surges.

In this case, by using the wide band gap semiconductor, use of a substrate having a cooling characteristic as in the past is made unnecessary, so that the thickness of the insulating substrate can be reduced. Thereby, the distance between the conductors on the front and the rear of the substrate is reduced, so that the offset effect of inductances is enhanced. Further, it is unnecessary to design element arrangement or the like paying attention to heat generation timing of the transistor elements and the diode elements for the purpose of heat dissipation and cooling.

Parts of the output conductor patterns 24 are configured to be plane-symmetrical to each other on the front surface side and the rear surface side of the insulating substrate 21 and are arranged to be opposed to each other interposing the insulating substrate 21 therebetween. Consequently, it is possible to offset inductance components of the output conductor patterns 24 and reduce noise and surges.

The bonding wires W11 and W13 are arranged to be plane-symmetrical to each other interposing the insulating substrate 21 therebetween and the bonding wires W12 and W14 are arranged to be plane-symmetrical to each other interposing the insulating substrate 21 therebetween. Consequently, it is possible to offset inductance components of the bonding wires W11 to W14 and reduce noise and surges.

The IGBTs functioning as the transistor chips 25 mounted on the front of the insulating substrate 21 has the collector terminals soldered to the conductor patterns and the emitter terminals connected the bonding wires. The IGBTs functioning as the transistor chips 26 mounted on the rear of the insulating substrate 21 has the emitter terminals soldered to the conductor patterns and the collector terminals connected with the bonding wires. Therefore, it is possible to separate the conductor patterns on the positive side and the negative side and the output conductor patterns 24.

The conductor patterns on the positive side and the negative side and the output conductor patterns 24 are arranged so that stray capacitance present between the conductor patterns on the positive side and the negative side and the output conductor patterns 24 is smaller than junction capacitance present in the transistor chips and the diode chips. Consequently, it is possible to suppress potential fluctuation of the output conductor patterns 24 from being transmitted to the positive side conductor pattern 22a and the negative side conductor pattern 23a via the stray capacitance between the conductor patterns on the positive side and the negative side and the output conductor patterns 24.

The snubber capacitors 31 are disposed on the side surface on the side H11 side of the insulating substrate 21. Consequently, it is possible to arrange the snubber capacitors 31 in the vicinity of and at the shortest distance from the upper arm and the lower arm without increasing the area of the insulating substrate 21. Therefore, it is possible to reduce the length of wires used for connection of the snubber capacitors 31, and connect the snubber capacitors 31 at the shortest distance while suppressing increase in inductance components. Thereby, it is possible to more effectively reduce surges and a high-frequency noise component flowing between the upper arm and the lower arm in conjunction with the inductance offset effect of the conductor patterns on the positive side and the negative side arranged on the front and the rear of the insulating substrate 21.

Third Embodiment

FIG. 4(a) is a plan view showing a schematic configuration of a power semiconductor module PM3 of a third embodiment according to the present invention. FIG. 4(b) is a rear view showing the schematic configuration of the power semiconductor module PM3 of the third embodiment according to the present invention. FIG. 4(c) is a side view showing the schematic configuration of the power semiconductor module PM3 of the third embodiment according to the present invention.

Figure 4:
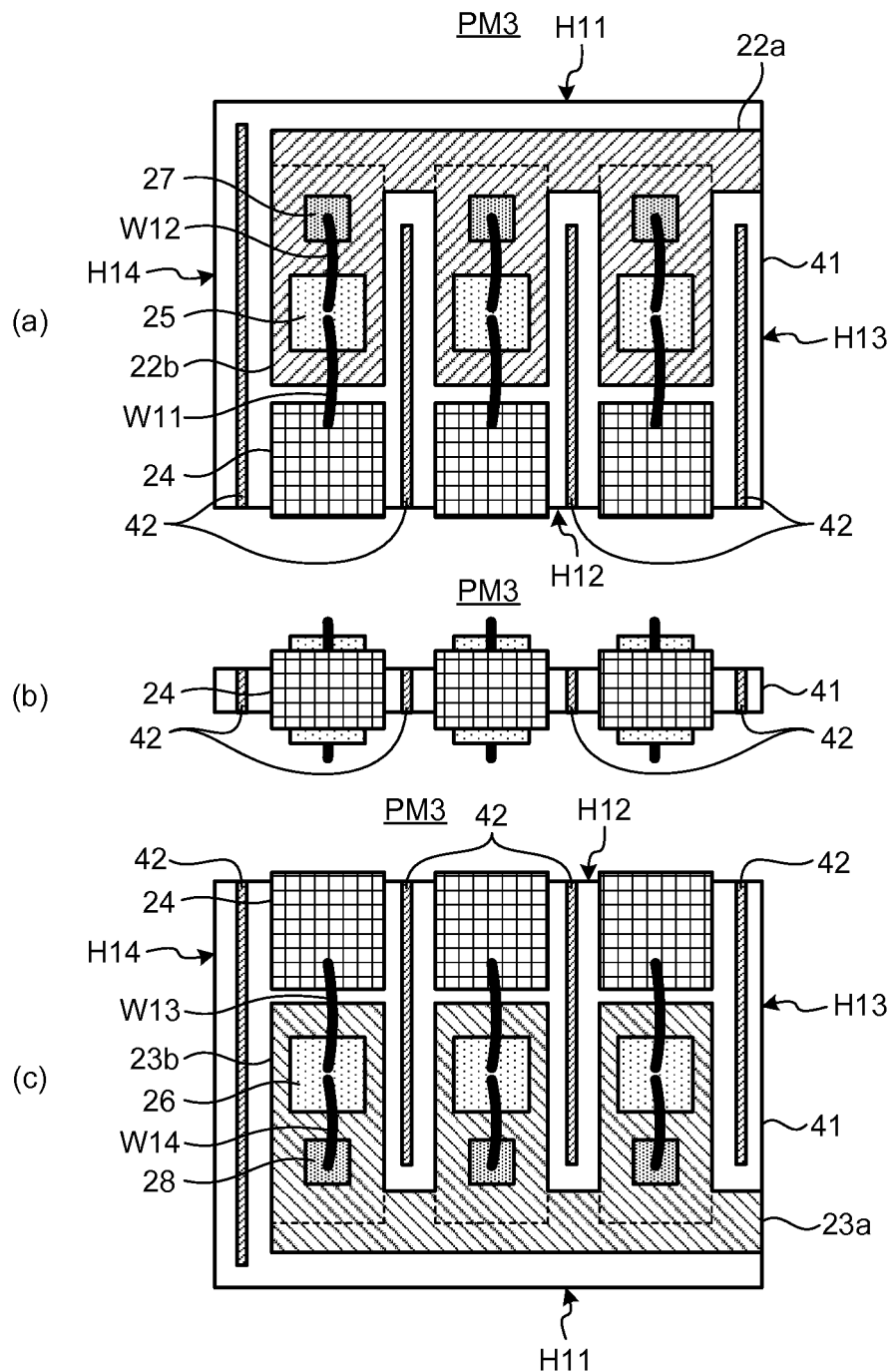
FIG. 4 has a plan view (a) showing a schematic configuration of the power semiconductor module of a third embodiment according to the present invention, a rear view (b) showing the schematic configuration of the power semiconductor module of the third embodiment according to the present invention, and a side view (c) showing the schematic configuration of the power semiconductor module of the third embodiment according to the present invention.

In FIG. 4, in the power semiconductor module PM3, an insulating substrate 41 is provided in place of the insulating substrate 21 of the power semiconductor module PM2 shown in FIG. 3. In the insulating substrate 41, magnetic-flux shields 42 are provided in addition to the constructions on the insulating substrate 21.

The magnetic-flux shield 42 can shield a magnetic flux for each of the phases. The magnetic-flux shields 42 are embedded in the insulating substrate 41 to vertically pierce through the insulating substrate 41. The magnetic-flux shield 42 is arranged substantially in a center of the arms adjacent to one another not to be in contact with the positive side conductor patterns 22a and 22b, the negative side conductor patterns 23a and 23b, and the output conductor patterns 24. As a material of the magnetic-flux shields 42, for example, iron, stainless steel or ferrite can be used. As a method of forming the magnetic-flux shields 42, slits may be formed in the insulating substrate in advance, and subsequently the magnetic-flux shields 42 may be inserted in the slits.

Because the magnetic-flux shields 42 are provided in the insulating substrate 41, even when a high-frequency current flows to the arm of a certain phase, it is possible to reduce the influence of a magnetic flux generated in the arm of the phase on the arms of the other phases.

In the configuration of the third embodiment shown in FIG. 4, the positive side potential terminals 29, the negative side potential terminals 30, and the snubber capacitors 31 shown in FIG. 3 are omitted. However, the positive side potential terminals 29, the negative side potential terminals 30, and the snubber capacitors 31 shown in FIG. 3 may be provided on the insulating substrate 41.

In the configuration of the third embodiment shown in FIG. 4, the magnetic-flux shields 42 are provided in the insulating substrate of the power semiconductor module PM2 shown in FIG. 3. However, it is possible to block a magnetic flux for each of the phases even when the magnetic-flux shields 42 are provided in the insulating substrate in the configuration of the power semiconductor module PM1 shown in FIG. 1.

Fourth Embodiment

FIG. 5(a) is a plan view showing a schematic configuration of a power semiconductor module PM4 of a fourth embodiment according to the present invention. FIG. 5(b) is a side view showing the schematic configuration of the power semiconductor module PM4 of the fourth embodiment according to the present invention. FIG. 5(c) is a rear view showing the schematic configuration of the power semiconductor module PM4 of the fourth embodiment according to the present invention.

Figure 5:
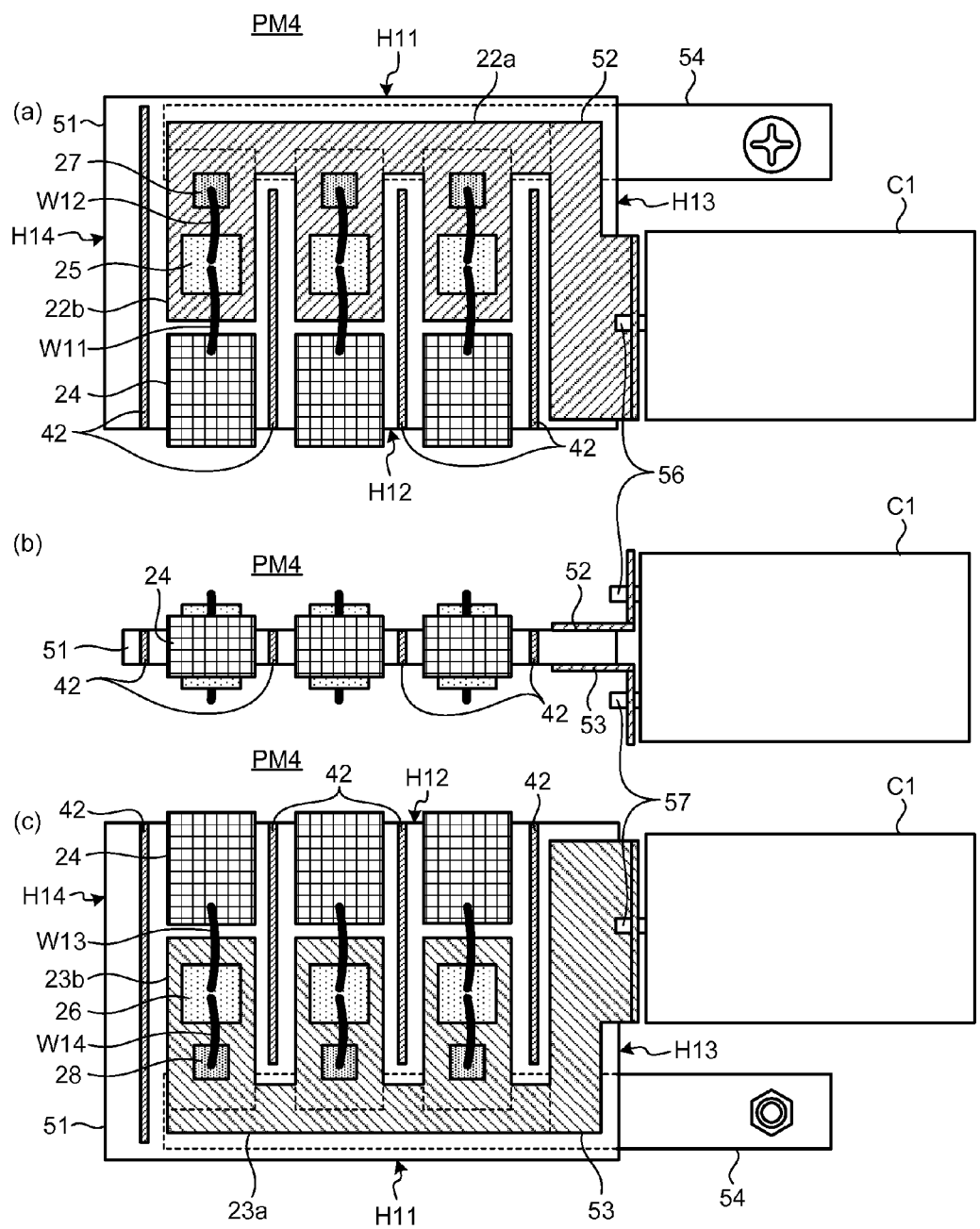
FIG. 5 has a plan view (a) showing a schematic configuration of a power semiconductor module of a fourth embodiment according to the present invention, a side view (b) showing the schematic configuration of the power semiconductor module of the fourth embodiment according to the present invention, and a rear view (c) showing the schematic configuration of the power semiconductor module of the fourth embodiment according to the present invention.

In FIG. 5, in the power semiconductor module PM4, an insulating substrate 51 is provided in place of the insulating substrate 41 of the power semiconductor module PM3 shown in FIG. 4. On the insulating substrate 51, a positive side conductor pattern 52 and a negative side conductor pattern 53 are provided in addition to the constructions on the insulating substrate 41.

The positive side conductor pattern 52 is formed on the front surface of the insulating substrate 51, while the negative side conductor pattern 53 is formed on the rear surface of the insulating substrate 51. The positive side conductor pattern 52 and the negative side conductor pattern 53 are configured to be plane-symmetrical to each other and arranged to be opposed to each other interposing the insulating substrate 51 therebetween.

The positive side conductor pattern 52 is connected to the positive side conductor pattern 22a and arranged in a peripheral edge portion of the insulating substrate 51 along the side H13. The positive side conductor pattern 52 can be configured to extend beyond the side H13 and can be erected in the perpendicular direction with respect to the insulating substrate 51. The positive side conductor pattern 52 can be formed integrally with the positive side conductor pattern 22a.

The negative side conductor pattern 53 is connected to the negative side conductor pattern 23a and arranged in the peripheral edge portion of the insulating substrate 51 along the side H13. The negative side conductor pattern 53 is configured to extend beyond the side H13 and structured to be erected in the perpendicular direction with respect to the insulating substrate 51. The negative side conductor pattern 53 can be formed integrally with the negative side conductor pattern 23a.

A connection terminal 56 is connected to the positive side conductor pattern 52, while a connection terminal 57 is connected to the negative side conductor pattern 53. The connection terminal 56 may be inserted in an erected portion of the positive side conductor pattern 52. The connection terminal 57 may be inserted in an erected portion of the negative side conductor pattern 53. The smoothing capacitor C1 is disposed on the side surface on the side H13 side of the insulating substrate 51. The connection terminals 56 and 57 are connected via the smoothing capacitor C1.

Alternatively, the smoothing capacitor C1 and the connection terminals 56 and 57 may be integrally formed to connect the said smoothing capacitor C1 to the positive side conductor pattern 52 and the negative side conductor pattern 53. A form of the connection only has to be a form in which the smoothing capacitor C1 and the positive side conductor pattern 52 and negative side conductor pattern 53 can be electrically connected by soldering or screwing with a conductive screw to fix terminals of the smoothing capacitor C1 on the positive side conductor pattern 52 and the negative side conductor pattern 53.

In the insulating substrate 51, a ground potential conductor 54 connected to a ground potential is provided. The ground potential conductor 54 is disposed in an inner layer of the insulating substrate 51 to be held between the positive side conductor pattern 22a and the negative side conductor pattern 23a. Then, the ground potential conductor 54 can be led out by way of a side surface of the insulating substrate 51 on the side H13 side.

Because the smoothing capacitor C1 is disposed on the side of the insulating substrate 51, it is possible to place the smoothing capacitor C1 in the vicinity of the upper arm and the lower arm. Therefore, it is possible to make the wirings used for the connection of the smoothing capacitor C1 shorter and plane-symmetrical on the front and the rear of the insulating substrate 51. Consequently, it is possible to reduce a mounting area of the power semiconductor module PM4 and realize reduction in noise, reduction in size, and reduction in costs for the power semiconductor module PM4.

Because the ground potential conductor 54 is disposed to be held between the positive side conductor pattern 22a and the negative side conductor pattern 23a, it is possible to form stray capacitance between the positive and negative side conductor patterns 22a and 23a and the ground potential conductor 54. This stray capacitance functions as a Y capacitor (or a line bypass capacitor), and can exert a noise reduction effect of the same degree as in the case where a Y capacitor having a value equivalent to the stray capacitance is connected externally. Therefore, it is possible to realize reduction in noise, reduction in size, and reduction in costs for the power semiconductor module PM4.

The ground potential conductor 54 is arranged to be held between the positive side conductor pattern 22a and the negative side conductor pattern 23a. Therefore, it is possible to reduce the influence of magnetic fluxes generated from the upper and lower arms on the ground potential conductor 54.

In the fourth embodiment shown in FIG. 5, there is described a method of connecting only one smoothing capacitor C1. However, this embodiment may be applied to a method of connecting a plurality of smoothing capacitors C1. This embodiment may be applied to a method of connecting a plurality of high voltage capacitors of a surface mounting type in series and parallel.

In the fourth embodiment shown in FIG. 5, a method of providing the magnetic-flux shields 42 in the insulating substrate 51 is explained. However, this embodiment may be applied to a configuration not including the magnetic-flux shields 42. In the configuration of the fourth embodiment shown in FIG. 5, the positive side potential terminals 29, the negative side potential terminals 30, and the snubber capacitors 31 shown in FIG. 3 are omitted. However, the positive side potential terminals 29, the negative side potential terminals 30, and the snubber capacitors 31 shown in FIG. 3 may be provided on the insulating substrate 51. Further, in the configuration of the fourth embodiment shown in FIG. 5, the smoothing capacitor C1 and the ground potential conductor are provided for the power semiconductor module PM3 according to the third embodiment shown in FIG. 4. However, the smoothing capacitor C1 and the ground potential conductor may be provided in the power semiconductor module PM1 illustrated in the first embodiment shown in FIG. 1.

Fifth Embodiment

FIG. 6(a) is a plan view showing a schematic configuration of a power semiconductor module PM5 of a fifth embodiment according to the present invention. FIG. 6(b) is a side view showing the schematic configuration of the power semiconductor module PM5 of the fifth embodiment according to the present invention. FIG. 6(c) is a rear view showing the schematic configuration of the power semiconductor module PM5 of the fifth embodiment according to the present invention.

Figure 6:
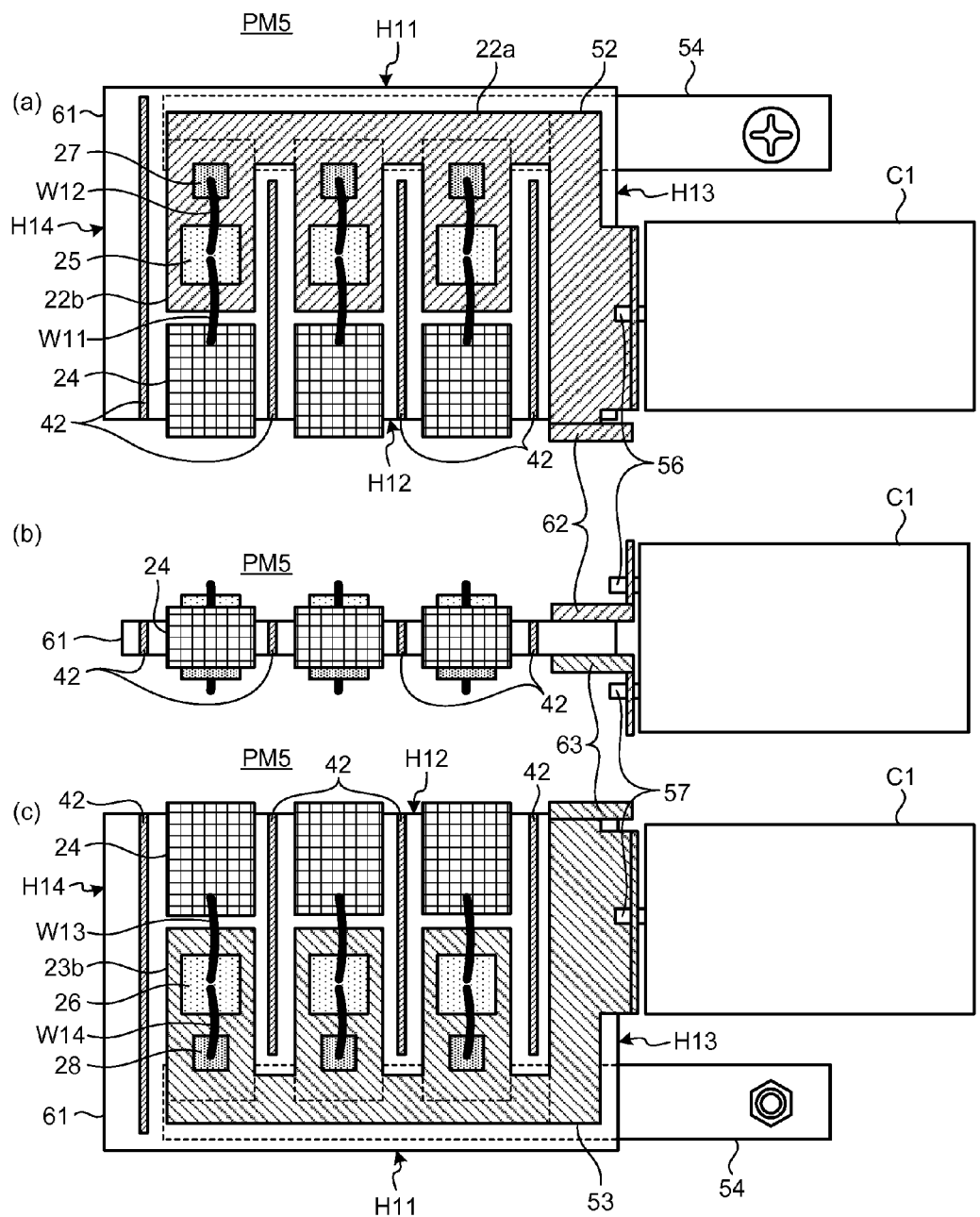
FIG. 6 has a plan view (a) showing a schematic configuration of the power semiconductor module of a fifth embodiment according to the present invention, a side view (b) showing the schematic configuration of the power semiconductor module of the fifth embodiment according to the present invention, and a rear view (c) showing the schematic configuration of the power semiconductor module of the fifth embodiment according to the present invention.

In FIG. 6, in the power semiconductor module PM5, an insulating substrate 61 is provided in place of the insulating substrate 51 of the power semiconductor module PM4 shown in FIG. 5. On the insulating substrate 61, a positive side potential terminal 62 and a negative side potential terminal 63 are provided in addition to the constructions on the insulating substrate 51.

The positive side potential terminal 62 is formed on the front surface of the insulating substrate 61. The negative side potential terminal 63 is formed on the rear surface of the insulating substrate 61. The positive side potential terminal 62 and the negative side potential terminal 63 are configured to be plane-symmetrical to each other and are arranged to be opposed to each other interposing the insulating substrate 61 therebetween.

The positive side potential terminal 62 is connected to the positive side conductor pattern 52 and arranged on the side surface on the side H12 side of the insulating substrate 61. The positive side potential terminal 62 is configured to extend beyond the side H12. The amount of overextension of the positive side potential terminal 62 from the side H12 is set equal to the amount of overextension of the output conductor patterns 24 from the side H12. In this way, it is possible to align surface positions of the positive side potential terminal 62 and the output conductor patterns 24. The positive side potential terminal 62 can be formed integrally with the positive side conductor pattern 52.

The negative side potential terminal 63 is connected to the negative side conductor pattern 53 and arranged on the side surface on the side H12 side of the insulating substrate 61. The negative side potential terminal 63 is configured to extend beyond the side H12. The amount of overextension of the negative side potential terminal 63 from the side H12 is set equal to the amount of overextension of the output conductor patterns 24 from the side H12. In this way, it is possible to align surface positions of the negative side potential terminal 63 and the output conductor patterns 24. The negative side potential terminal 63 can be formed integrally with the negative side conductor pattern 53.

Consequently, it is possible to align the surface positions of the positive side potential terminal 62, the negative side potential terminal 63, and the output conductor patterns 24. Therefore, it is possible to collectively connect the positive side potential terminal 62, the negative side potential terminal 63, and the output conductor patterns 24 by mounting the insulating substrate 61 in an erected state thereof. Thereby, it is possible to connect the inverter 3 to the converter 2 and the motor 4 while suppressing increase in the mounting area of the inverter 3 shown in FIG. 2.

For the positive side potential terminal 62 and the negative side potential terminal 63, conductors that can be soldered may be used or connectors may be used. When the connectors are used for the positive side potential terminal 62 and the negative side potential terminal 63, it is desirable to connect the connectors to the output conductor patterns 24.

Sixth Embodiment

FIG. 7(a) is a plan view showing a schematic configuration of a power semiconductor module PM6 of a sixth embodiment according to the present invention. FIG. 7(b) is a rear view showing the schematic configuration of the power semiconductor module PM6 of the sixth embodiment according to the present invention.

Figure 7:
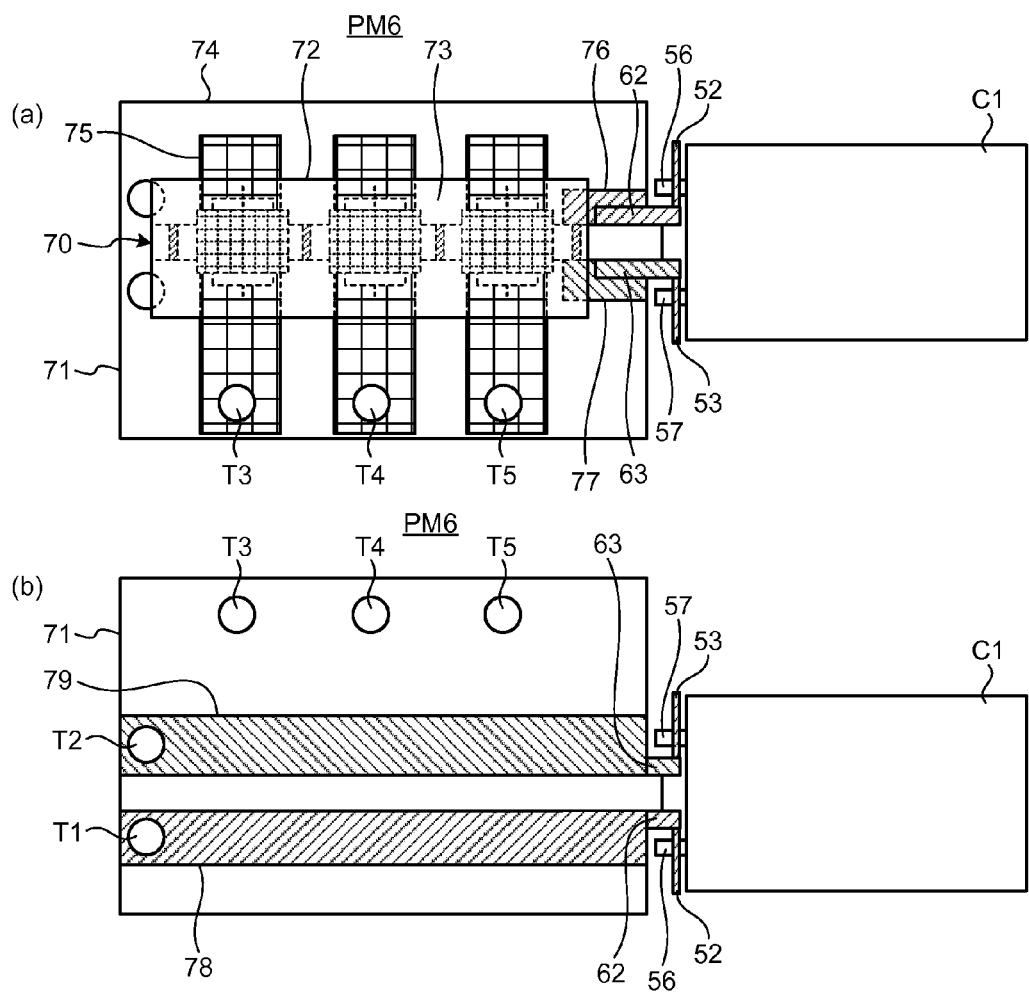
FIG. 7 has a plan view (a) showing a schematic configuration of a power semiconductor module of a sixth embodiment according to the present invention, and a rear view (b) showing the schematic configuration of the power semiconductor module of the sixth embodiment according to the present invention.

In FIG. 7, in the power semiconductor module PM6, a connection mediating substrate 71 realizing mediation for connecting the power semiconductor module PM6 to a converter and an external load is provided in addition to the constructions shown in FIG. 6. Herein, the insulating substrate 61 shown in FIG. 6 is housed in a case 72 and sealed by a sealing resin 73 to constitute the power semiconductor module PM6.

For the sealing resin 73, for example, epoxy resin or silicone resin can be used. When the insulating substrate 61 is sealed with the sealing resin 73, the positive side potential terminal 62, the negative side potential terminal 63, and the output conductor patterns 24 are exposed to the outside from the sealing resin 73 on the side surface side of the insulating substrate 61 on the side H12 side.

An insulating substrate 74 is provided on the connection mediating substrate 71. For a material of the insulating substrate 74, a resin substrate such as a glass epoxy resin may be used, a film substrate formed of polyimide or the like may be used, or an inorganic substrate such as a ceramic substrate may be used.

Output conductor patterns 75, a positive side conductor pattern 76 for terminal connection, and a negative side conductor pattern 77 for terminal connection are formed on the front surface of the insulating substrate 74. A positive side conductor pattern 78 for wiring and a negative side conductor pattern 79 for wiring are formed on the rear surface of the insulating substrate 74.

The output conductor patterns 75 are formed for the respective phases and can be arranged in parallel to one another. An array pitch of the output conductor patterns 75 is desirably set equal to an array pitch of the output conductor patterns 24 shown in FIG. 6.

The positive side conductor pattern 76 and the negative side conductor pattern 77 are arranged in a peripheral edge portion of the insulating substrate 74 to be opposed to each other on the insulating substrate 74. When the output conductor patterns 24 are arranged on the output conductor patterns 75, respectively, it is desirable to set arrangement positions of the positive side conductor pattern 76 and the negative side conductor pattern 77 such that the positive side potential terminal 62 is arranged on the positive side conductor pattern 76 and the negative side potential terminal 63 is arranged on the negative side conductor pattern 77.

The positive side conductor pattern 78 and the negative side conductor pattern 79 are arranged in parallel to each other to traverse the insulating substrate 74. It is desirable to arrange the positive side conductor pattern 78 and the negative side conductor pattern 79 to be orthogonal to the output conductor patterns 75. Then, the positive side conductor pattern 78 is connected to the positive side conductor pattern 76. The negative side conductor pattern 79 is connected to the negative side conductor pattern 77.

As a method of connecting the positive side conductor pattern 78 to the positive side conductor pattern 76 and connecting the negative side conductor pattern 79 to the negative side conductor pattern 77, for example, it is possible to use a method of forming a through-hole in the insulating substrate 74 and connecting the conductor patterns via the through-hole.

As a material of the output conductor patterns 75, the positive side conductor patterns 76 and 78, and the negative side conductor patterns 77 and 79, metal having satisfactory electric conductivity such as Cu or Al can be used. The surfaces of the output conductor patterns 75, the positive side conductor patterns 76 and 78, and the negative side conductor patterns 77 and 79 may be coated with a solder material.

A direct-current input terminal T1 is connected to the positive side conductor pattern 78. A direct-current input terminal T2 is connected to the negative side conductor pattern 79. Alternating-current output terminals T3 to T5 are connected to the output conductor patterns 75 for the respective phases. As the direct-current input terminal T1 and the alternating-current output terminals T3 to T5, screws may be used, solder materials may be used, or wires may be used.

The power semiconductor module PM6 is arranged on the insulating substrate 74 such that the smoothing capacitor C1 is arranged on the side surface side of the insulating substrate 74. The positive side potential terminal 62 is connected to the positive side conductor pattern 76, the negative side potential terminal 63 is connected to the negative side conductor pattern 77, and the output conductor pattern 24 is connected to the output conductor pattern 75 for each of the phases.

As a method of connecting the positive side potential terminal 62 and the positive side conductor pattern 76, connecting the negative side potential terminal 63 and the negative side conductor pattern 77, and connecting the output conductor patterns 24 and the output conductor patterns 75, solder joining can be used. Alternatively, connectors connected to the positive side conductor pattern 76, the negative side conductor pattern 77, and the output conductor patterns 75 may be provided to use connector joining for such connections.

The inverter circuit 3 shown in FIG. 2 can be connected to the smoothing capacitor C1 at the shortest distance and conductors that connect the inverter circuit 3 and the smoothing capacitor C1 can be arranged plane-symmetrically, so that it is easy to offset inductances.

The positive side conductor patterns 78 and the negative side conductor patterns 79 are arranged in parallel. Therefore, it is possible to offset an inductance component of the positive side conductor pattern 78 against an inductance component of the negative side conductor pattern 79, so as to reduce noise and surges.

The positive side conductor pattern 78 and the negative side conductor pattern 79 are arranged to be orthogonal to the output conductor patterns 75. Therefore, it is possible to suppress high-frequency components such as noise from being superimposed between the positive and negative side conductor patterns 78 and 79 and the output conductor patterns 75.

Seventh Embodiment

FIG. 8(a) is a plan view showing a schematic configuration of a power semiconductor module PM7 of a seventh embodiment according to the present invention. FIG. 8(b) is a rear view showing the schematic configuration of the power semiconductor module PM7 of the seventh embodiment according to the present invention.

Figure 8:
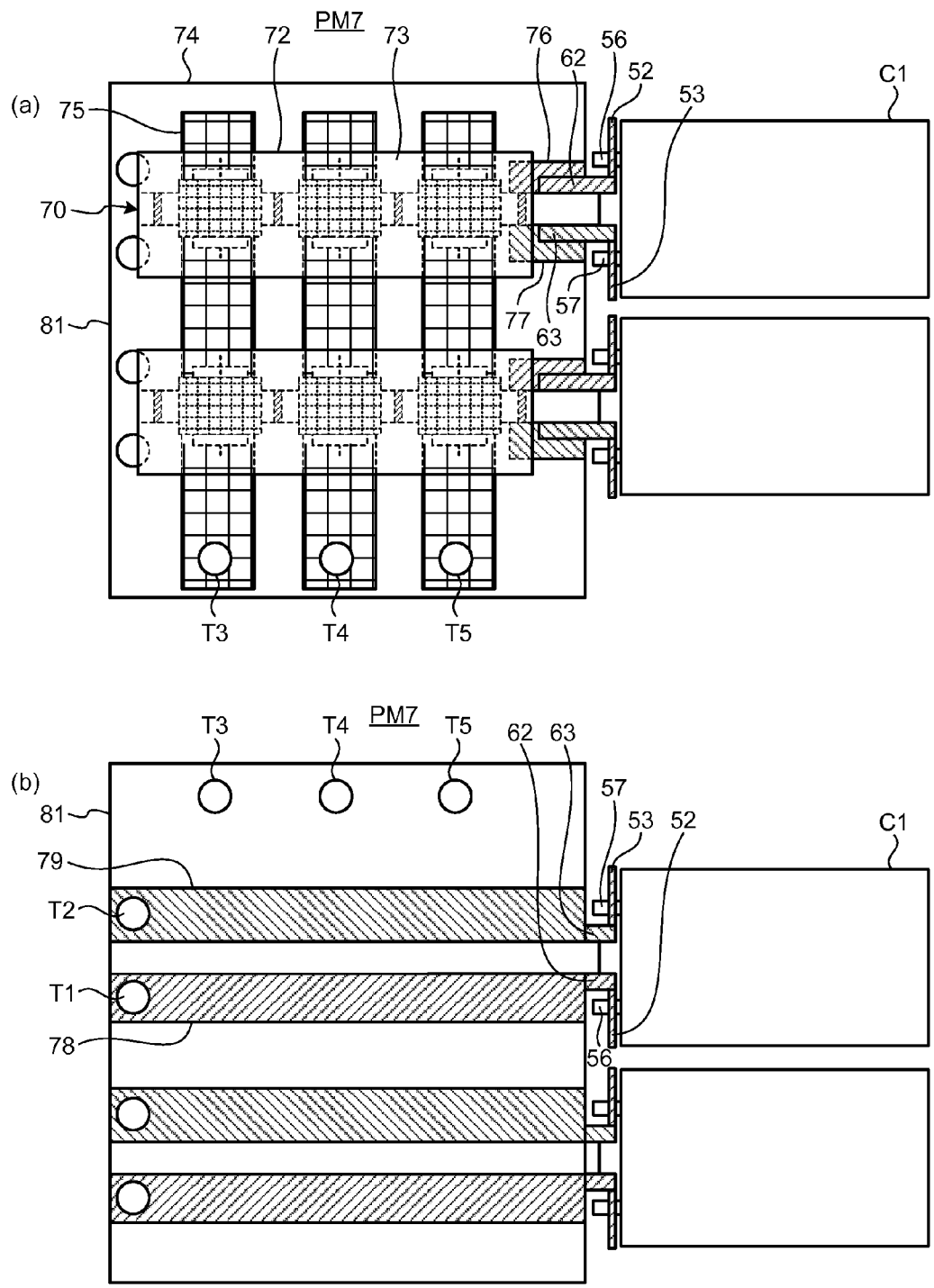
FIG. 8 has a plan view (a) showing a schematic configuration of a power semiconductor module of a seventh embodiment according to the present invention, and a rear view (b) showing the schematic configuration of the power semiconductor module of the seventh embodiment according to the present invention.

In FIG. 8, in the power semiconductor module PM7, a connection mediating substrate 81 is provided in place of the connection mediating substrate 71 of the power semiconductor module PM6 shown in FIG. 7. On the front surface of the connection mediating substrate 81, a plurality of sets of the positive side conductor patterns 76 and the negative side conductive patterns 77 are arranged in parallel, each of the sets consisting of the positive side conductor pattern 76 and the negative side conductor pattern 77 shown in FIG. 7. On the rear surface of the connection mediating substrate 81, a plurality of sets of the positive side conductor patterns 78 and the negative side conductive patterns 79 are arranged in parallel, each of the sets consisting of the positive side conductor pattern 78 and the negative side conductor pattern 79 shown in FIG. 7. On the connection mediating substrate 81, a plurality of cases 72 are arranged in an array.

Consequently, it is possible to connect a plurality of power semiconductor modules PM7 to one another at the shortest distance while suppressing increase in wiring paths between the power semiconductor modules PM7 and the smoothing capacitors. Therefore, it is possible to realize increase in the capacity of a power converting device while suppressing increase in size of the power converting device.

Eighth Embodiment

FIG. 9(a) is a plan view showing a schematic configuration of a power semiconductor module PM8 of an eighth embodiment according to the present invention. FIG. 9(b) is a rear view showing the schematic configuration of the power semiconductor module PM8 of the eighth embodiment according to the present invention. FIG. 9(c) is a side view showing the schematic configuration of the power semiconductor module PM8 of the eighth embodiment according to the present invention.

Figure 9:
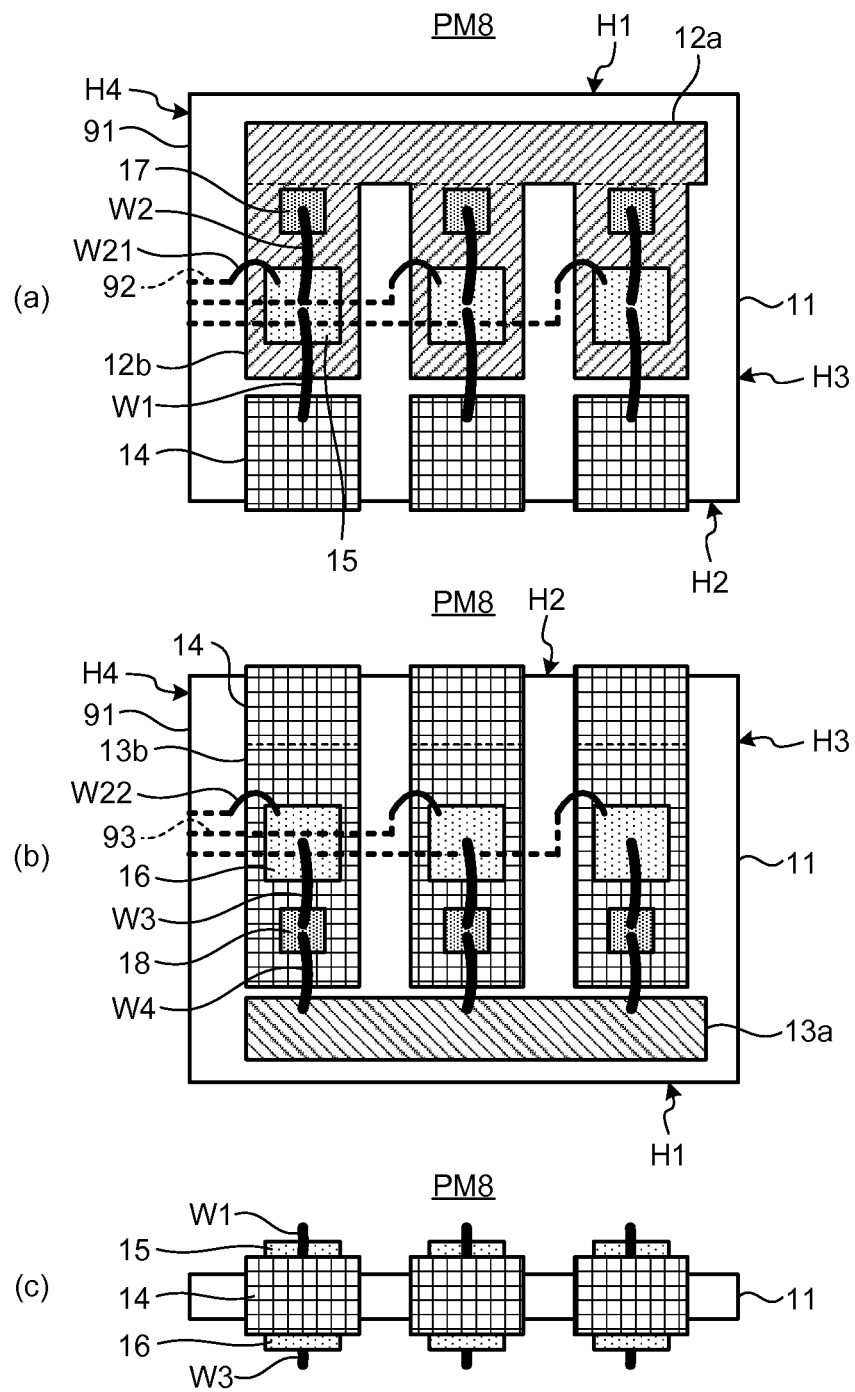
FIG. 9 has a plan view (a) showing a schematic configuration of a power semiconductor module of an eighth embodiment according to the present invention, a rear view (b) showing the schematic configuration of the power semiconductor module of the eighth embodiment according to the present invention, and a side view (c) showing the schematic configuration of the power semiconductor module of the eighth embodiment according to the present invention.

In FIG. 9, in the power semiconductor module PM8, an insulating substrate 91 is provided in place of the insulating substrate 11 of the power semiconductor module PM1 shown in FIG. 1. In the insulating substrate 91, control signal lines 92 and 93 for transmitting signals for performing switching control of the transistor elements M1 to M6 shown in FIG. 2 are provided in addition to the constructions on the insulating substrate 11. The control signal lines 92 and 93 can be formed in an inner layer of the insulating substrate 91 to cross the upper arm UA and the lower arm LA. For connection of the control signal lines 92 and 93 and the transistor chips 15 and 16, bonding wires can be used, for example.

The control signal lines 92 and 93 are arranged to cross the upper arm UA and the lower arm LA. Therefore, it is possible to suppress high-frequency components such as noise from being superimposed between the upper and lower arms UA and LA and the control signal lines 92 and 93.

Ninth Embodiment

Figure 10:
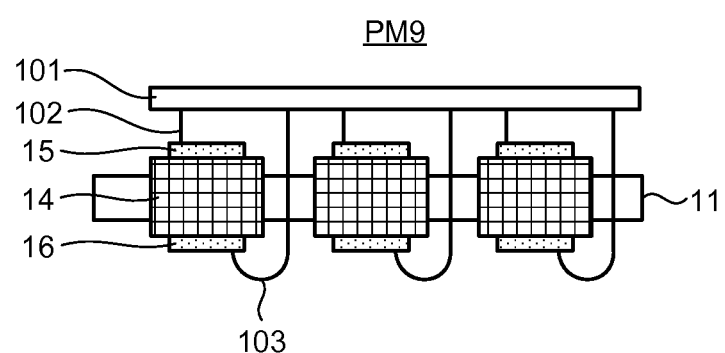
FIG. 10 is a side view showing a schematic configuration of a power semiconductor module of a ninth embodiment according to the present invention.

FIG. 10 is a side view showing a schematic configuration of a power semiconductor module PM9 of a ninth embodiment according to the present invention. In FIG. 10, in the power semiconductor module PM9, a control substrate 101 is provided in addition to the constructions of the power semiconductor module PM1 shown in FIG. 1. A control circuit that performs the switching control of the transistor chips 15 and 16 shown in FIG. 1 can be mounted on the control substrate 101. The control substrate 101 can be arranged on the insulating substrate 11 to be opposed to the insulating substrate 11.

Control signal lines 102 and 103 for transmitting signals for performing the switching control of the transistor elements M1 to M6 shown in FIG. 2 are led out from the control substrate 101 in the vertical direction and connected to the transistor chips 15 and 16, respectively. When the control signal lines 102 and the transistor chips 15 are connected, the control signal lines 102 can be drawn out straight from the control substrate 101.

When the control signal lines 103 and the transistor chips 16 are connected, the control signal lines 103 can be drawn out from the control substrate 101 to avoid the insulating substrate 11, and bent toward the transistor chips 16. As the control signal lines 102 and 103, bonding wires can be used, for example.

The control signal lines 102 and 103 are drawn out from the control substrate 101 in the vertical direction. Therefore, it is possible to suppress high-frequency components such as noise from being superimposed between the upper and lower arms UA and LA and the control signal lines 102 and 103.

Tenth Embodiment

Figure 11:
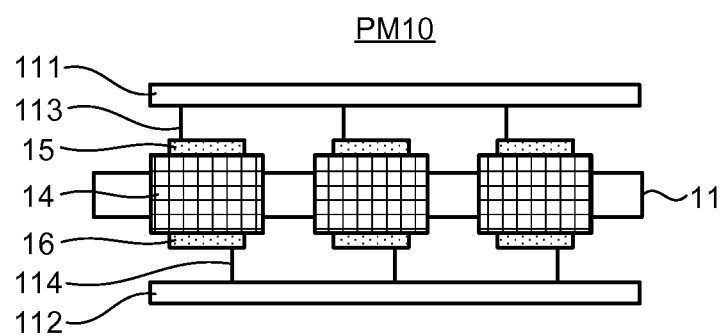
FIG. 11 is a side view showing a schematic configuration of the power semiconductor module of a tenth embodiment according to the present invention.

FIG. 11 is a side view showing a schematic configuration of a power semiconductor module PM10 of a tenth embodiment according to the present invention. In FIG. 11, in the power semiconductor module PM10, control substrates 111 and 112 are provided in addition to the constructions of the power semiconductor module PM1 shown in FIG. 1. A control circuit that performs the switching control of the transistor elements M1, M3 and M5 shown in FIG. 2 can be mounted on the control substrate 111. A control circuit that performs the switching control of the transistor elements M2, M4 and M6 shown in FIG. 2 can be mounted on the control substrate 112. The control substrates 111 and 112 can be arranged to be opposed to each other interposing the insulating substrate 11 therebetween.

Control signal lines 113 for transmitting signals for performing the switching control of the transistor elements M1, M3 and M5 shown in FIG. 2 are led out from the control substrate 111 in the vertical direction and connected to the transistor chips 15. Control signal lines 114 for transmitting signals for performing the switching control of the transistor elements M2, M4 and M6 shown in FIG. 2 are led out from the control substrate 112 in the vertical direction and connected to the transistor chips 16. As the control signal lines 113 and 114, bonding wires can be used, for example.

The control signal lines 113 and 114 are drawn out from the control substrates 111 and 112 in the vertical direction, respectively. Therefore, it is possible to suppress high-frequency components such as noise from being superimposed between the upper and lower arms UA and LA and the control signal lines 113 and 114.

Eleventh Embodiment

Figure 12:
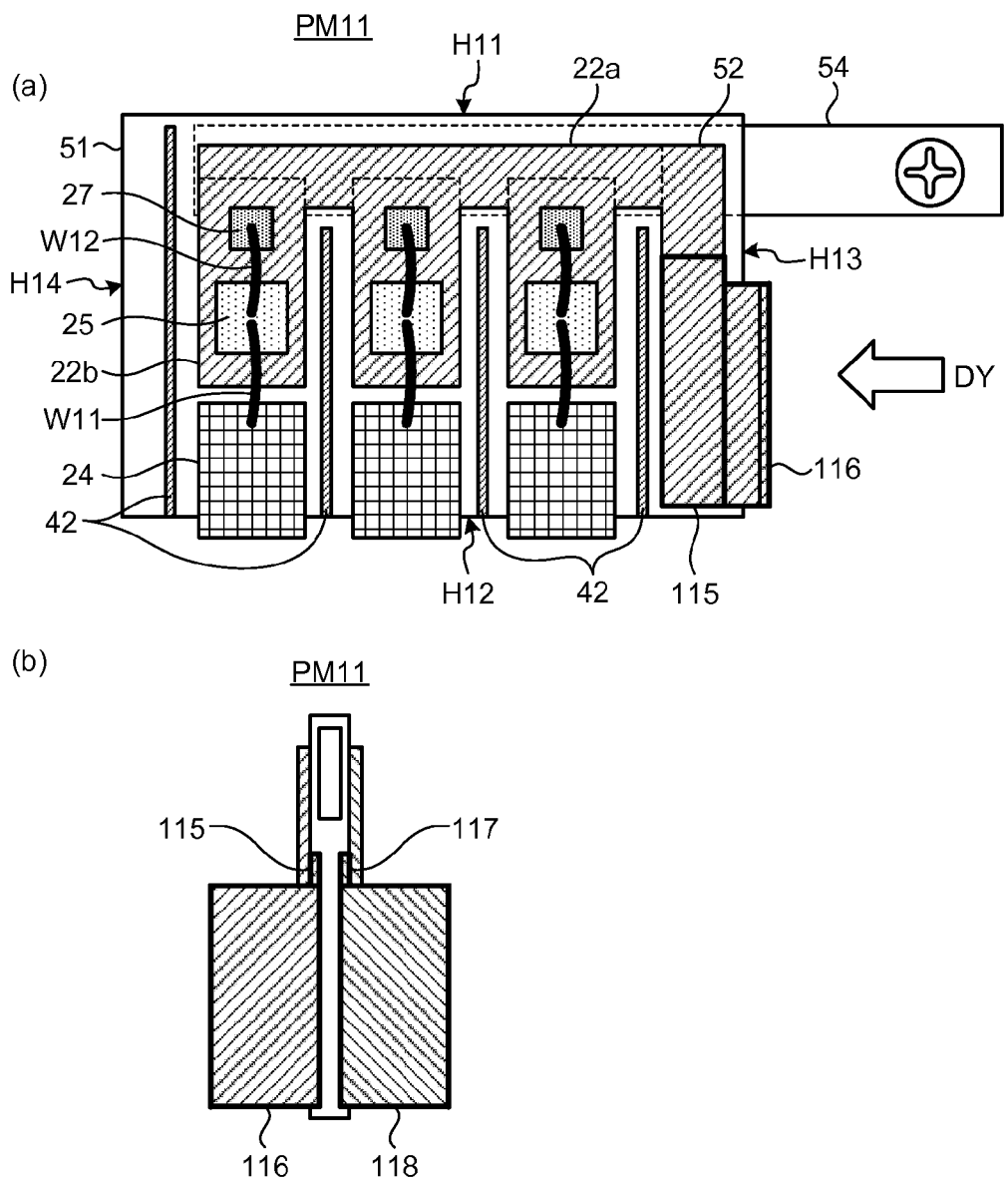
FIG. 12 has a plan view (a) showing a schematic configuration of a power semiconductor module of an eleventh embodiment according to the present invention, and a side view (b) showing a schematic configuration of the power semiconductor module of the eleventh embodiment according to the present invention.

FIG. 12(a) is a plan view showing a schematic configuration of a power semiconductor module PM11 of an eleventh embodiment according to the present invention. FIG. 12(b) is a side view showing a schematic configuration of the power semiconductor module PM11 of the eleventh embodiment according to the present invention as viewed in an arrow direction DY shown in FIG. 12(a).

A distance between positive side conductor patterns 115 and 116 and negative side conductor patterns 117 and 118 is set smaller than a distance between the positive side conductor patterns and the negative side conductor patterns explained in the fourth embodiment and set to a distance at which an insulative distance can be secured. The positive side conductor pattern 115 is located in a region without the ground potential conductor of the positive side conductor pattern 52 explained in the fourth embodiment (a region indicated by a thick frame line in FIG. 12(a)). The positive side conductor pattern 116 is formed integrally with the positive side conductor pattern 115 and erected in the perpendicular direction with respect to the insulating substrate 51. The negative side conductor pattern 117 is located in the region without the ground potential conductor. The negative side conductor pattern 118 is formed integrally with the negative side conductor pattern 117 and erected in the perpendicular direction with respect to the insulating substrate 51.

The gap between the positive side conductor patterns and the negative side conductor patterns is set narrower, so that the offset effect of inductance increases, thereby making it possible to reduce noise and surges.

INDUSTRIAL APPLICABILITY

As explained above, the power semiconductor module according to the present invention can cause the switching chips and the diode chips to be mounted on both the surfaces of the substrate without interposing a cooling substrate, and is suitable for a method of realizing reduction in noise, reduction in size, and reduction in costs of the power semiconductor module by means of optimally arranging the conductors on both the surfaces of the substrate.

REFERENCE SIGNS LIST

PM1-PM11 power semiconductor module
UA upper arm
LA lower arm
11, 21, 41, 51, 61, 74, 91 insulating substrate
12a, 12b, 22a, 22b, 52, 76, 78, 115, 116 positive side conductor pattern
13a, 13b, 23a, 23b, 53, 77, 79, 117, 118 negative side conductor pattern
14, 24, 75 output conductor pattern
15, 16, 25, 26 transistor element
17, 18, 27, 28 diode element
29, 62 positive side potential terminal
30, 63 negative side potential terminal
31 snubber capacitor
W1-W4, W11-W14, W21, W22 bonding wire
1 three-phase power supply
2 converter
3 inverter
4 motor
5 power converting device
D1-D6 rectifying diode
C1 smoothing capacitor
T1, T2 direct-current input terminal
T3-T5 alternating-current output terminal
42 magnetic-flux shield
54 ground potential conductor
56, 57 connection terminal
70 inverter module
71, 81 connection mediating substrate
72 case
73 sealing resin
92, 93, 102, 103, 113, 114 control signal line
101, 111, 112 control substrate

The invention claimed is:

1. A power semiconductor module comprising:
a first insulating substrate, on which conductor patterns are formed;
first transistor elements for a plurality of upper arms mounted on a front surface of the first insulating substrate and formed from a wide band gap semiconductor; and
second transistor elements for a plurality of lower arms mounted on a backside surface of the first insulating substrate which is opposing to the front surface, and formed from a wide band gap semiconductor,
wherein a plurality of phases comprising pairs of the upper arm and the lower arm are connected by inter-phase connection at positive terminals of the upper arms and negative terminals of the lower arms of each of the phases;
wherein the conductor patterns include:
a first direct-current potential side conductor pattern integrally connecting a plurality of pairs of the upper arms for inter-phase connection formed on the front surface of the first insulating substrate; and
a second direct-current potential side conductor pattern integrally connecting a plurality of pairs of the lower arms for inter-phase connection formed on the backside surface of the first insulating substrate and arranged to be opposed to the first direct-current potential side conductor pattern for inter-phase connection to be plane-symmetrical to the first direct-current potential side conductor pattern for inter-phase connection.

2. The power semiconductor module according to claim 1, further comprising:
a first freewheeling diode element connected to the first transistor element and formed from a wide band gap semiconductor; and
a second freewheeling diode element connected to the second transistor element and formed from a wide band gap semiconductor.

3. The power semiconductor module according to claim 1, wherein the wide band gap semiconductor is SiC.

4. The power semiconductor module according to claim 1, wherein the conductor patterns include:
a first direct-current potential side conductor pattern for element arrangement formed on the front surface of the first insulating substrate and connected to the first direct-current potential side conductor pattern for inter-phase connection, the first transistor element being arranged on the first direct-current potential side conductor pattern for element arrangement; and
a second direct-current potential side conductor pattern for element arrangement formed on the backside surface of the first insulating substrate, connected to the second direct-current potential side conductor pattern for inter-phase connection, and arranged to be opposed to the first direct-current potential side conductor pattern for element arrangement to be plane-symmetrical to the first direct-current potential side conductor pattern for element arrangement, the second transistor element being arranged on the second direct-current potential side conductor pattern for chip arrangement.

5. The power semiconductor module according to claim 1, wherein the first and second direct-current potential side conductor patterns for inter-phase connection are arranged in a peripheral edge portion of the first insulating substrate along a first side of the first insulating substrate.

6. The power semiconductor module according to claim 5, further comprising a first output conductor pattern arranged for each of phases in the peripheral edge portion of the first insulating substrate along a second side opposed to the first side of the first insulating substrate.

7. The power semiconductor module according to claim 6, wherein parts of the first output conductor pattern are arranged to be plane-symmetrical to each other on the front surface side and the backside surface side of the first insulating substrate.

8. The power semiconductor module according to claim 7, wherein the first output conductor pattern is configured to hold the first insulating substrate from above and below by way of a side surface of the first insulating substrate.

9. The power semiconductor module according to claim 1, wherein direct-current potential surfaces of the first transistor element and the second transistor element are arranged on the first insulating substrate side.

10. The power semiconductor module according to claim 1, wherein the first direct-current potential side conductor pattern and the second direct-current potential side conductor pattern are separate elements.

11. The power semiconductor module according to claim 1, wherein the second direct-current potential side conductor pattern is arranged to be vertically aligned via the insulating substrate with the first direct-current potential side conductor pattern.

* * * * *